United States Patent
Lee

(10) Patent No.: US 7,119,435 B2
(45) Date of Patent: Oct. 10, 2006

(54) SEMICONDUCTOR DEVICE WITH SOURCE/DRAIN EXTENSION LAYER

(75) Inventor: Jae-Kyu Lee, Daegu-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 74 days.

(21) Appl. No.: 10/440,354

(22) Filed: May 15, 2003

(65) Prior Publication Data
US 2004/0080003 A1    Apr. 29, 2004

(30) Foreign Application Priority Data
Oct. 26, 2002    (KR)    ............. 10-2002-0065649

(51) Int. Cl.
*H01L 29/78* (2006.01)
*H01L 29/68* (2006.01)
*H01L 29/70* (2006.01)
*H01L 29/43* (2006.01)

(52) U.S. Cl. ............... 257/714; 257/382; 257/344; 257/401; 257/408; 257/900

(58) Field of Classification Search ............ 257/382, 257/344, 401, 408, 900; 438/184, 230, 299, 438/446
See application file for complete search history.

(56) References Cited

U.S. PATENT DOCUMENTS

| | | | |
|---|---|---|---|
| 4,046,607 A | | 9/1977 | Inoue et al. |
| 4,713,356 A | * | 12/1987 | Hiruta ................ 438/297 |
| 5,057,899 A | | 10/1991 | Samata et al. |
| 5,093,275 A | | 3/1992 | Tasch, Jr. et al. |
| 5,156,994 A | * | 10/1992 | Moslehi ............. 438/647 |
| 5,182,619 A | * | 1/1993 | Pfiester .............. 257/382 |
| 5,352,927 A | | 10/1994 | Cote et al. |
| 5,545,581 A | | 8/1996 | Armacost et al. |
| 5,597,746 A | * | 1/1997 | Prall ................ 438/300 |
| 5,827,768 A | | 10/1998 | Lin et al. |
| 6,107,145 A | * | 8/2000 | Dennison et al. ......... 438/297 |
| 6,218,271 B1 | | 4/2001 | Lee et al. |
| 6,284,610 B1 | | 9/2001 | Cha et al. |
| 6,365,451 B1 | | 4/2002 | Havemann |

FOREIGN PATENT DOCUMENTS

| | | |
|---|---|---|
| EP | 0785573 | 7/1997 |
| EP | 1223610 | 7/2002 |
| GB | 1457800 | 12/1976 |

(Continued)

OTHER PUBLICATIONS

English Language Abstract of Japan Patent No.: JP8340113.

(Continued)

*Primary Examiner*—Alexander Oscar Williams
(74) *Attorney, Agent, or Firm*—Marger Johnson & McCollom, P.C.

(57) ABSTRACT

In a MOS transistor and a method of manufacturing the same, a gate structure including a gate insulating layer and a gate electrode is formed on a semiconductor substrate. A first insulating layer is formed to cover the gate structure. A second insulating layer is formed on the substrate that is spaced apart from the first insulating layer. A lightly doped source/drain region is formed in the surface portions of the substrate between the second insulating layer and the gate structure. A source/drain extension layer are formed on the lightly doped source/drain region. A heavily doped source/drain region is formed on the second insulating layer so as to connect with the source/drain extension layer. The short channel effect is suppressed and the source/drain junction capacitance is reduced.

14 Claims, 7 Drawing Sheets

FOREIGN PATENT DOCUMENTS

| | | | |
|---|---|---|---|
| JP | 8-213616 | * | 8/1996 |
| JP | 8213616 | | 8/1996 |
| JP | 8-340113 | * | 12/1996 |
| JP | 8340113 | | 12/1996 |

OTHER PUBLICATIONS

English Language Abstract of Japan Patent No.: JP8213616.

* cited by examiner

SEMICONDUCTOR DEVICE WITH SOURCE/DRAIN EXTENSION LAYER

CROSS REFERENCE TO RELATED APPLICATIONS

This application claims priority from Korean Patent Application 2002-65649 filed on Oct. 26, 2002, the contents of which are herein incorporated by reference in their entirety for all purposes.

BACKGROUND OF THE INVENTION

1. Field of the Invention

The invention relates to a semiconductor device and a method of manufacturing the same. More particularly, the invention relates to a semiconductor device capable of suppressing a short channel effect and reducing a source/drain junction capacitance, and a method of manufacturing the same.

2. Description of the Related Art

As semiconductor devices are developed having a high degree of integration, an active region becomes smaller in size. Thus, a gate length of a MOS transistor formed on the active region becomes shorter. As the gate length decreases, the influence of the source/drain upon the electric field or the potential in the channel region of the MOS transistor correspondingly increases. This is known as the "short channel effect" and a lowering of the threshold voltage is a typical result. This is because the channel region is greatly influenced by the depletion charge, the electric field, and the potential distribution of the source/drain regions as well as the gate voltage.

In addition to lowering the threshold voltage, a "punch-through effect" between the source/drain is a severe problem accompanying the short channel effect.

Specifically, the drain depletion layer is widened in proportion to the increase in the drain voltage, so that the drain depletion layer comes close to the source region. Thus, the drain depletion layer and the source depletion layer are completely connected to each other when the length of the gate electrode is decreased. The electric field of the drain may eventually penetrate into the source region and thus reduce the potential energy barrier of the source junction. When this occurs, more major carriers in the source region have enough energy to overcome the barrier, and then, an increased current flows from the source region to the drain region. This is known as the "punchthrough" phenomenon. When the punchthrough occurs, the drain current is not saturated but dramatically increases in the saturation region.

The short channel effect becomes more severe as the source/drain junction depth is increased and the channel doping concentration is decreased. Various methods have been developed to form a shallow source/drain junction depth, whereby the short channel effect can be suppressed to some degree.

In general, the shallow source/drain junction is obtained with a low energy ion implantation process that lessens the physical junction depth in a silicon substrate, resulting in a decrease in the transistor current.

Furthermore, methods in which metal silicide layers are formed on the surface of the source/drain regions through a self-aligned silicide (i.e., salicide) process so as to reduce parasitic resistances in the source/drain regions, e.g., sheet resistance and contact resistance, with the decrease in the gate length have been used. However, as the source/drain junction depth becomes shallower, it becomes more difficult to apply the salicide process.

Accordingly, in order to obtain a high-performance transistor, the parasitic resistances in the source/drain regions should be minimized to increase the transistor current, while also suppressing the short-channel effect. The typical method is one where the MOS transistors are formed on a silicon-on-insulator (SOI) substrate. In the SOI transistor, a buried oxide layer is located under the source/drain junctions to remove a depletion capacitance of the source/drain junctions. However, the SOI transistor has a floating body because no body contact is formed on the SOI substrate. Therefore, a layer of accumulated holes is formed at the interface in the rear of the SOI layer, thereby generating floating body effects such as parasitic bipolar breakdown, latch-up, etc.

SUMMARY OF THE INVENTION

The invention solves the afore-mentioned problems and accordingly, it is a first object of the invention to provide a MOS transistor capable of suppressing the short channel effect and decreasing the source/drain junction capacitance.

It is a second object of the invention to provide a method of manufacturing a MOS transistor capable of suppressing the short channel effect and decreasing the source/drain junction capacitance.

In order to achieve the first object of the invention, embodiments of the invention include a semiconductor substrate and a gate structure including a gate insulating layer and a gate electrode successively formed on the substrate. A first insulating layer is formed on the top and the sides of the gate structure. Second insulating layers are formed on the substrate and are spaced apart from the first insulating layer. Lightly doped source/drain regions are formed in the surface portions of the substrate between the gate structure and the second insulating layers. Source/drain extension layers are formed on the lightly doped source/drain regions. Heavily doped source/drain regions are formed on the second insulating layers so as to make contact with the source/drain extension layers. Preferably, the source/drain extension layers include a doped epitaxial layer, and the heavily doped source/drain regions include a doped polysilicon layer.

Furthermore, according to another embodiment of the invention, a gate structure is formed on a semiconductor substrate, the gate structure including a gate insulating layer and a gate electrode stacked on the gate insulating layer. A first insulating layer is formed on the top and the sides of the gate structure. Second insulating layers are formed on the substrate and are spaced apart from the first insulating layer. Lightly doped source/drain regions are formed in the surface portions of the substrate between the gate structure and the second insulating layers. Heavily doped source/drain regions are formed on the second insulating layers so as to fill gaps between the gate structure and the second insulating layers.

Preferably, the heavily doped source/drain regions include a doped epitaxial layer or a doped polysilicon layer.

According to another embodiment that achieves the second object of the invention, a gate structure including a gate insulating layer and a gate electrode stacked on the gate insulating layer is formed on a semiconductor substrate. A first insulating layer is formed on the top and the sides of the gate structure. Second insulating layers are formed on the substrate to be spaced apart from the first insulating layer.

An impurity is ion-implanted in the surface of the substrate between the gate structure and the second insulating layers, thereby forming lightly doped source/drain regions. Source/drain extension layers are formed on the lightly doped source/drain regions. Heavily doped source/drain regions are formed on the second insulating layers so as to make contact with the source/drain extension layers.

Furthermore, according to another embodiment of the invention, a gate structure in which a gate insulating layer and a gate electrode are successively stacked is formed on a semiconductor substrate, and then, a first insulating layer is formed on the top and the sides of the gate structure. Second insulating layers are formed on the substrate to be spaced apart from the first insulating layer. An impurity is ion-implanted in the surface portions of the substrate between the gate structure and the second insulating layers, thereby forming lightly doped source/drain regions. Then, heavily doped source/drain regions are formed on the second insulating layers so as to fill gaps between the gate structure and the second insulating layers.

According to embodiments of the invention, a channel region and the lightly doped source/drain regions (i.e., LDD regions) are formed in the surface of the semiconductor substrate, while the heavily doped source/drain regions are formed on the insulating layer, thereby obtaining the MOS transistor having the similar structure to that of the SOI transistor and performing the same operation as that of a transistor formed on a bulk silicon substrate. So, the short channel effect is suppressed and the source/drain junction capacitance is decreased, resulting in the improvement in the operating speed of the device.

BRIEF DESCRIPTION OF THE DRAWINGS

The above and other objects and advantages of the present invention will become readily apparent by reference to the following detailed description when considered in conjunction with the accompanying drawings wherein.

DETAILED DESCRIPTION OF THE INVENTION

Figure 1:
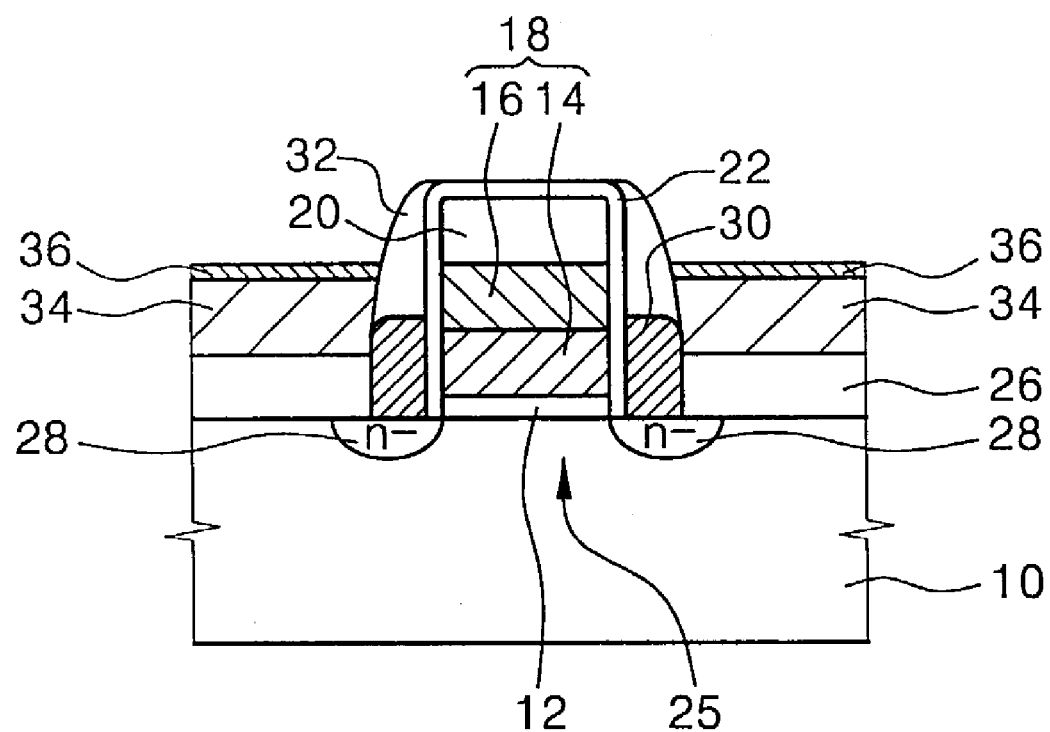
FIG. 1 is a cross-sectional view of a MOS transistor according to an embodiment of the invention.

Hereinafter, the preferred embodiments of the invention will be described in detail with reference to the accompanying drawings, where like reference numerals indicate like elements throughout.

FIG. 1 is a cross-sectional view of a MOS transistor according to an embodiment of the invention.

Referring to FIG. 1, a gate structure 25 including a gate insulating layer 12 and a gate electrode 18 is formed on a semiconductor substrate 10. Optionally, the gate structure 25 further includes a gate capping layer 20 formed on the gate electrode 18. The gate capping layer 20 includes an insulating material such as silicon nitride or silicon oxide. In the present embodiment, the gate capping layer 20 is silicon nitride.

The gate electrode 18 is formed into a polycide structure in which a polysilicon layer 14 and a metal silicide layer 16 are successively stacked.

A first insulating layer 22 is formed on the top and the sides of the gate structure 25 (that is, the first insulating layer 22 is formed so as to cover the gate structure 25). Preferably, an oxidation process is executed so as to cure silicon damages caused by an etching process of patterning the gate structure 25, thereby forming the first insulating layer 22 composed of silicon oxide.

According to the MOS transistor of the present embodiment, second insulating layers 26 composed of silicon oxide are formed on the substrate 10, while being spaced apart from the first insulating layer 22.

Lightly doped source/drain regions 28, i.e., LDD regions are formed in the surface of the substrate between the gate structure 25 and the second insulating layers 26.

Source/drain extension layers 30 are formed on the lightly doped source/drain regions 28. Preferably, the source/drain extension layers 30 are doped epitaxial layers.

Heavily doped source/drain regions 34 are formed on the second insulating layers 26 so as to make contact with the source/drain extension layers 30. Preferably, the heavily doped source/drain regions 34 are doped polysilicon layers.

Gate spacers 32 including an insulating material such silicon nitride are formed between the heavily doped source/drain regions 34 and the gate structure 25. Preferably, the gate spacers 32 are formed to the same width as in the source/drain extension layers 30.

Optionally, metal silicide layers 36 for reducing parasitic resistances are formed on the surfaces of the heavily doped source/drain regions 34.

FIGS. 2A to 2G are cross-sectional views illustrating a method of manufacturing the MOS transistor in accordance with the embodiment shown in FIG. 1.

Figure 2A:
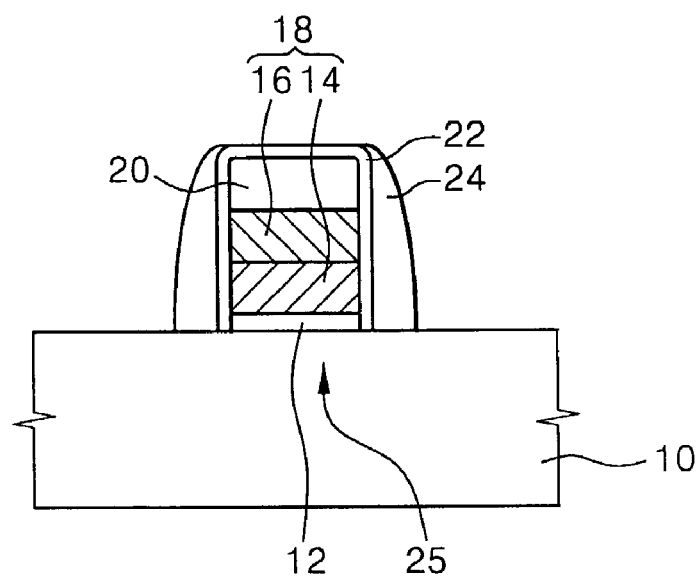
FIGS. 2A to 2G are cross-sectional views illustrating a method of manufacturing the MOS transistor in accordance with the embodiment shown in FIG. 1.

Referring to FIG. 2A, an isolation process is executed to divide a semiconductor substrate 10 into an active region and a field region. Next, a thermal oxidation process is carried out on the substrate 10 to thereby form a gate oxide layer 12 composed of silicon oxide. Here, the gate oxide layer 12 may alternately be composed of silicon oxynitride.

A polysilicon layer 14 is deposited on the gate oxide layer 12 and doped with n+ type impurities using a typical doping process, for example, $POCl_3$ diffusion, ion-implantation, or in-situ doping. Then, a metal silicide layer 16 such as tungsten silicide (WSix), titanium silicide (TiSix), tantalum silicide (TaSix), etc. is deposited on the polysilicon layer 14.

After depositing a silicon nitride on the metal silicide layer 16 to form a gate capping layer 20, these layers are patterned by a photolithography process to form a gate structure 25 including the gate oxide layer 12, a gate electrode 18, and the gate capping layer 20.

Next, an oxidation process is executed so as to cure silicon damages caused by the etching process of patterning the gate structure 25, thereby forming a first insulating layer 22 composed of silicon oxide on the top and the sides of the gate structure 25 so as to cover the gate structure 25.

A silicon nitride layer is deposited on the first insulating layer 22 and the substrate 10, which is then etched back to form sacrificing spacers 24 on both sides of the first insulating layer 22.

Figure 2B:
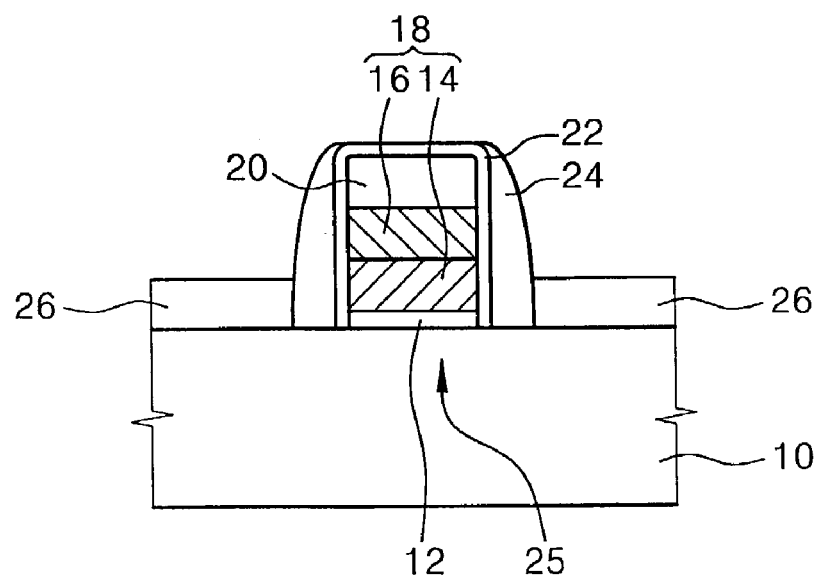

Referring to FIG. 2B, an oxidation process is carried out to oxidize the surface of the substrate 10 exposed by the sacrificing spacers 24. Accordingly, second insulating layers 26 are formed on the substrate 10 and thus are spaced apart from the first insulating layer 22.

Figure 2C:
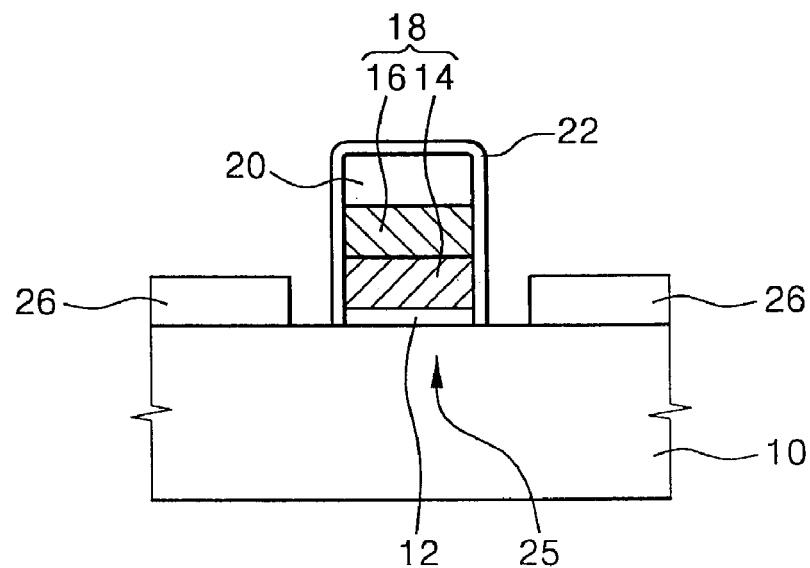

Referring to FIG. 2C, the sacrificing spacers 24 are selectively removed by a wet etching process having a selectivity with respect to silicon oxide. Here, the etching process does not cause damage to the gate structure 25 because the first insulating layer 22 is made of silicon oxide and surrounds the gate structure 25.

Figure 2D:
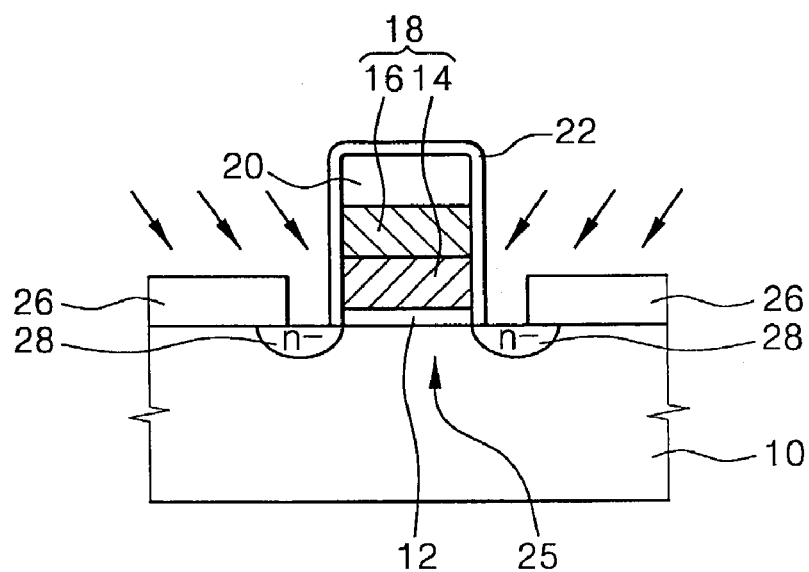

Referring to FIG. 2D, an n-type impurity such as phosphorous (P) is ion-implanted at a tilted angle to form lightly doped source/drain regions 28 serving as LDD regions in the surface of the substrate 10 between the second insulating layers 26 and the gate structure 25.

Figure 2E:
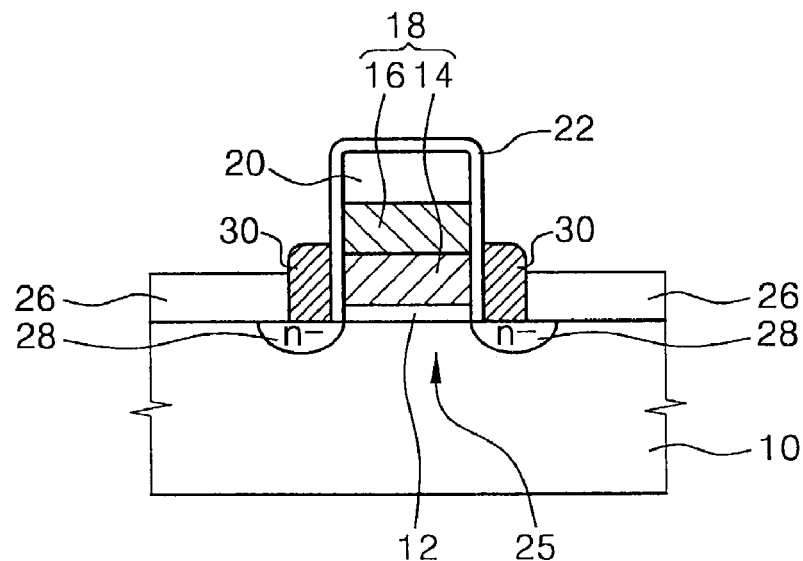

Referring to FIG. 2E, using a selective epitaxial growth process, n-type doped epitaxial layers are grown on the lightly doped source/drain regions 28 to form source/drain extension layers 30. Preferably, the source/drain extension layers 30 are grown so as to protrude from the top of the second insulating layers 26. The source/drain extension layers 30 are separated from the gate structure 28 by the first insulating layer 22.

Figure 2F:
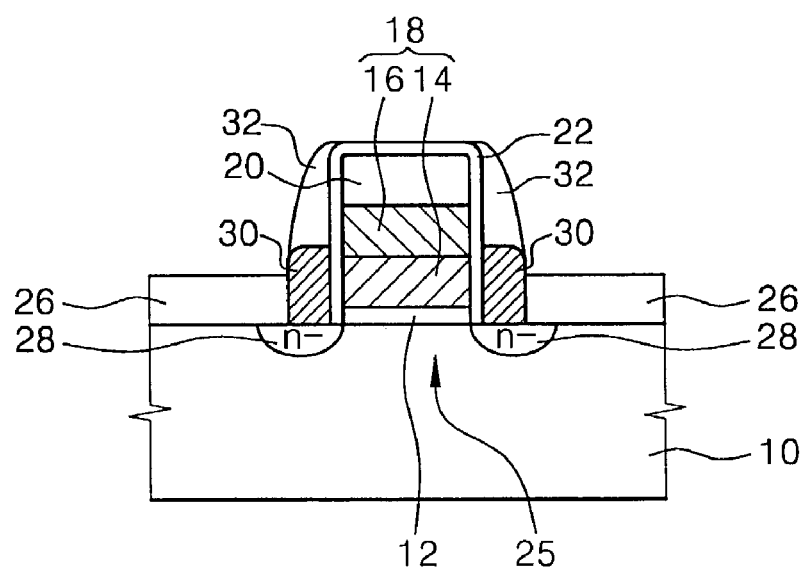

Referring to FIG. 2F, an insulating layer, e.g., a silicon nitride layer, is deposited on the entire surface of the substrate 10 including the source/drain extension layers 30. Next, the silicon nitride layer is etched back to form gate spacers 32 on both sides of the gate structure 25. Preferably, the gate spacers 32 are formed to the same width as in the source/drain extension layers 30. So, the gate spacers 32 are formed to remain only on the source/drain extension layers 30.

Figure 2G:
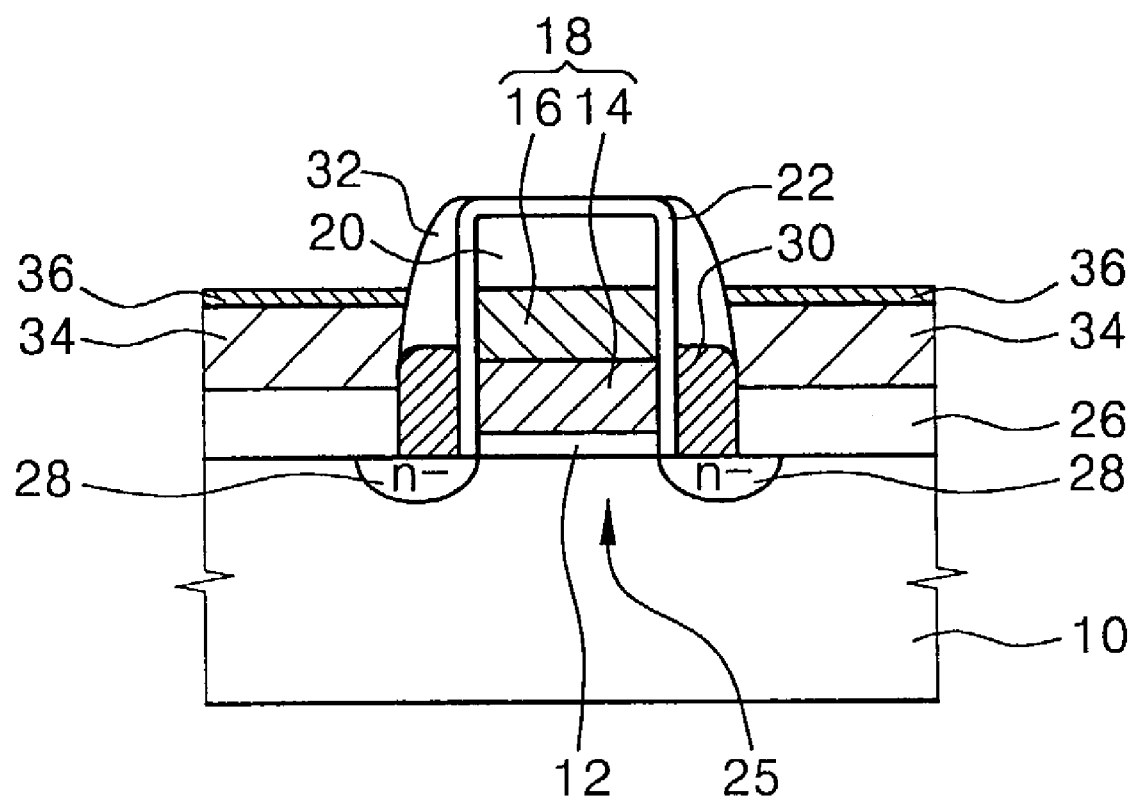

Referring to FIG. 2G, an n+ doped polysilicon layer is deposited on the second insulating layers 26 and then, etched back until the first insulating layer 22 located over the gate structure 25 is exposed, thereby forming heavily doped source/drain regions 34. The heavily doped source/drain regions 34 are connected to the lightly doped source/drain regions 28 through the source/drain extension layers 30, thereby completing the LDD structure.

Next, if required, a salicide process is carried out to form metal silicide layers 36 on the exposed silicon regions, e.g., the heavily doped source/drain regions 34.

According to the embodiment of the invention illustrated in FIG. 1, a channel region and the lightly doped source/drain regions 28 are formed in the surface portions of the semiconductor substrate 10, while the heavily doped source/drain regions 34 are formed on the semiconductor substrate 10 with the second insulating layers 26 interposed therebetween. Similar to the SOI structure, the second insulating layers 28 are located under the heavily doped source/drain regions 34 to substantially perform the same operation as that of the bulk transistor. Therefore, the short channel effect is suppressed and the source/drain junction capacitance is decreased, thereby enhancing the operating speed of the device.

Figure 3:
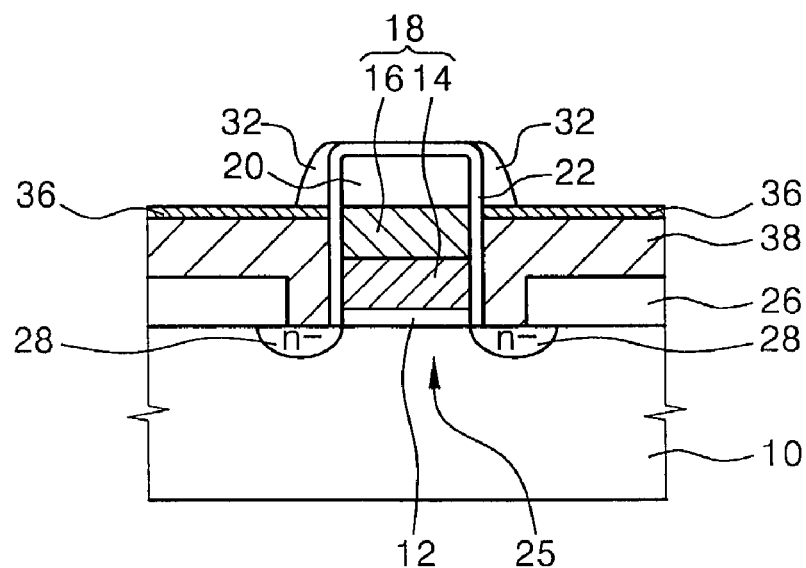
FIG. 3 is a cross-sectional view of a MOS transistor in accordance with another embodiment of the invention.

FIG. 3 is a cross-sectional view of a MOS transistor in accordance with another embodiment of the invention.

Referring to FIG. 3, the present embodiment is similar to the embodiment illustrated in FIG. 1 except that the heavily doped source/drain regions 38 are formed on second insulating layers 26 so as to fill gaps between a gate structure 25 and the second insulating layers 26.

Specifically, after forming the gate structure 25 including a gate oxide layer 12, a gate electrode 18, and a gate capping layer 20 on a semiconductor substrate 10, a first insulating layer 22 is formed on the top and the sides of the gate structure 25.

The second insulating layers 26 that are spaced apart from the first insulating layer 22 are formed on the substrate 10. Then, lightly doped source/drain regions 28 are formed in the surface portions of the semiconductor substrate 10 between the gate structure 25 and the second insulating layers 26.

Next, an n+ doped polysilicon layer is deposited on an entire surface of the substrate 10 including the lightly doped source/drain regions 28. The doped polysilicon layer is then etched back until the first insulating layer 22 located over the gate structure 25 is exposed, thereby forming the heavily doped source/drain regions 38 that fill the gaps between the gate structure 25 and the second insulating layers 26.

A salicide process is executed to form metal silicide layers 36 on the heavily doped source/drain regions 38. Next, a silicon nitride layer is deposited on an entire surface of the resultant structure and then etched back to form gate spacers 32 on both sides of the gate structure 25. Here, the gate spacers 32 are formed over the heavily doped source/drain regions 38.

Figure 4:
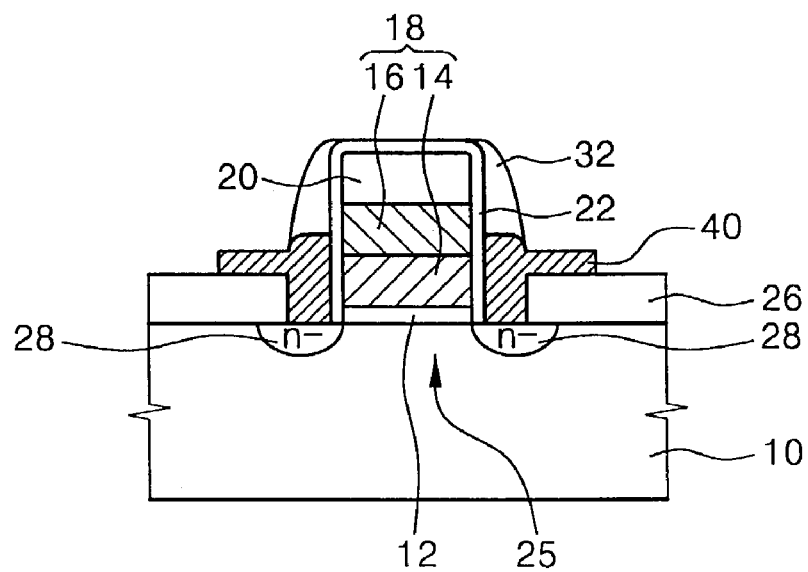
FIG. 4 is a cross-sectional view of a MOS transistor in accordance with yet another embodiment of the invention.

FIG. 4 is a cross-sectional view of a MOS transistor in accordance with yet another embodiment of the invention. This embodiment is similar to Embodiment 2 except that the heavily doped source/drain regions 40 comprise are doped epitaxial layers.

Specifically, like the embodiment illustrated in FIG. 3, lightly doped source/drain regions 28 are formed in the surface portions of the semiconductor substrate 10 between second insulating layers 26 and a gate structure 25 using an ion implantation process. Then, n+ doped epitaxial layers are grown on the lightly doped source/drain regions 28 by using a selective epitaxial growth process. Here, the n+ doped epitaxial layers are grown to protrude from the top of the second insulating layers 26. So, the heavily doped source/drain regions 40 are formed on the second insulating layers 26 so as to fill gaps between the second insulating layers 26 and the gate structure 25.

Figure 5:
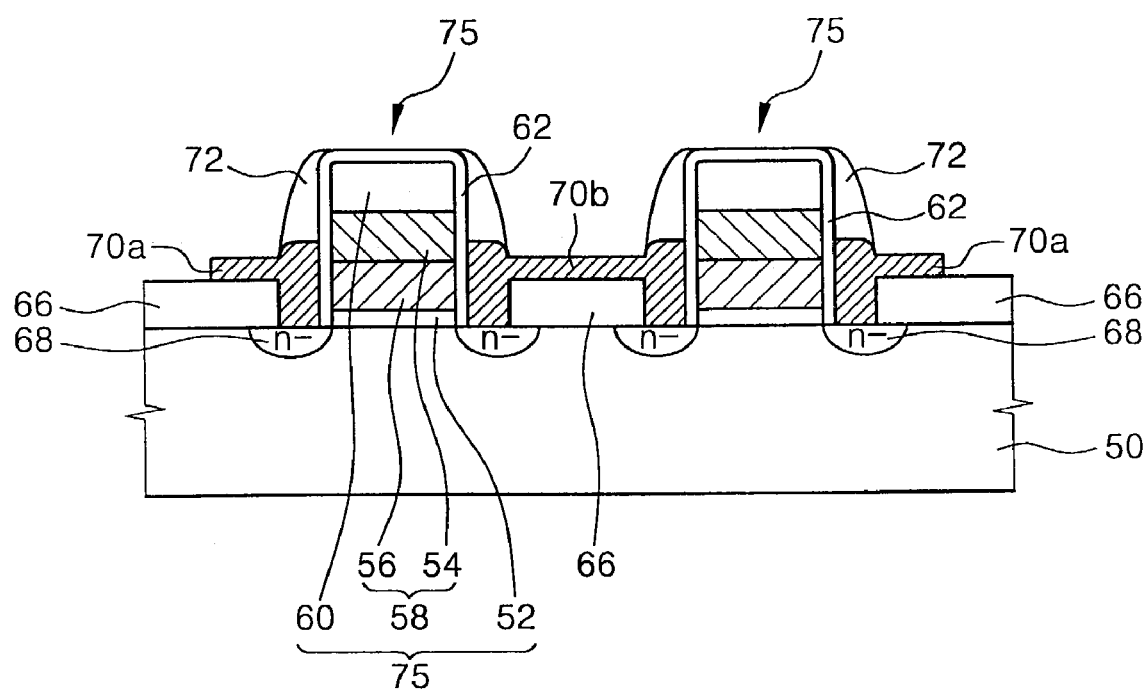
FIG. 5 is a cross-sectional view of memory cell transistors in accordance with still another embodiment of the present invention.

FIG. 5 is a cross-sectional view of memory cell transistors in accordance with still another embodiment of the present invention.

Referring to FIG. 5, two gate structures 75 are formed on a semiconductor substrate 10 so as to be spaced apart from each other. Each of the gate structures includes a gate insulating layer 52, a gate electrode 58, and a gate capping layer 60. The gate electrode 58 is formed into a polycide structure in which a polysilicon layer 54 and a metal silicide layer 56 are successively stacked. If required, the gate capping layer 60 may be omitted. In the present embodiment, the gate capping layer 60 is made of silicon nitride.

First insulating layers 62 are formed on the top and the sides of each of the gate structures 75. Preferably, the first insulating layers 62 are formed by an oxidation process for curing silicon damages caused by an etching process of patterning the gate structures 75.

Second insulating layers 66 are formed on the surface of the substrate spaced apart from the first insulating layer 62. Preferably, the second insulating layers 68 are formed through an oxidation process.

Lightly doped source/drain regions 68, i.e., LDD regions, are formed in the surface portions of the semiconductor substrate 10 between the gate structure 75 and the second insulating layers 62.

Heavily doped source/drain regions 70a and 70b are formed on the lightly doped source/drain regions 68 so as to fill gaps between the second insulating layers 62 and the gate structures 75 and to protrude from the top of the second insulating layers 62. Here, any one region of the heavily doped source/drain regions 70a and 70b, preferably drain region 70b, is formed connected to each other on the second insulating layer 66 between two gate structures 75. So, a memory cell structure is obtained in which two gate electrodes 58 commonly have one drain region 70b.

Preferably, the heavily doped source/drain regions 70a and 70b comprise n+ doped epitaxial layers formed by a selective epitaxial growth in the same manner as the embodiment illustrated in FIG. 4. Here, the n+ doped epitaxial layers are grown so as to make contact with each other between two gate structures 75.

According to embodiments of the invention as described above, the channel region and the lightly doped source/drain regions (i.e., LDD regions) are formed in the surface of the semiconductor substrate, while the heavily doped source/drain regions are formed on the insulating layer, thereby obtaining a MOS transistor with a structure similar to that of the SOI transistor and performing the same operation as that of a transistor formed on a bulk silicon substrate. So, the short channel effect is suppressed and the source/drain junction capacitance is decreased, resulting in an improvement in the operating speed of the device.

Although the preferred embodiments of the present invention have been described, it is understood that the invention should not be limited to these preferred embodiments but various changes and modifications can be made by one skilled in the art within the spirit and scope of the invention as hereinafter claimed.

The invention claimed is:

1. A semiconductor device comprising:
   a semiconductor substrate;
   a gate structure including a gate insulating layer and a gate electrode that are successively formed on the semiconductor substrate;
   a first insulating layer formed on a top and a first and a second side of the gate structure;
   a second insulating layer formed on the substrate and spaced apart from the first insulating layer;
   a lightly doped source/drain region formed in the surface portions of the substrate between the gate structure and the second insulating layer;
   a source/drain extension layer formed on the lightly doped source/drain regions;
   a heavily doped source/drain region formed on the second insulating layer and in contact with the source/drain extension layer; and
   a gate spacer disposed between the heavily doped source/drain region and the gate structure, the gate spacer including an insulating material, a maximum width of the gate spacer substantially the same as a width of the source/drain extension layer.

2. The device as claimed in claim 1, wherein the source/drain extension layer comprises a doped epitaxial layer, and the heavily doped source/drain region comprises a doped polysilicon layer.

3. The device as claimed in claim 1, wherein the gate spacer comprises silicon nitride.

4. The device as claimed in claim 1, further comprising a metal silicide layer formed on a surface of the heavily doped source/drain region.

5. The device as claimed in claim 1, wherein the first and second insulating layer comprise silicon oxide.

6. The device as claimed in claim 1, wherein the gate structure further comprises a gate capping layer formed on the gate electrode.

7. The device as claimed in claim 6, wherein the gate capping layer comprises silicon nitride.

8. A semiconductor device comprising:
   a semiconductor substrate;
   a gate structure that includes a gate insulating layer disposed on the semiconductor substrate and a gate electrode disposed on the gate insulating layer;
   a first insulating layer disposed on a top of the gate structure and disposed on a sidewall of the gate structure;
   a second insulating layer disposed on the substrate and spaced apart from the first insulating layer;
   a lightly doped source/drain region disposed in a surface portion of the substrate, the surface portion of the substrate beginning at an edge of the gate structure and extending to at least an edge of the second insulating layer;
   a source/drain extension layer disposed on the lightly doped source/drain region and between the first and second insulating layers;
   a heavily doped source/drain region disposed on the second insulating layer and in contact with the source/drain extension layer; and
   a gate spacer disposed on the source/drain extension layer and between the heavily doped source/drain region and the gate structure, the gate spacer including an insulating material, a maximum width of the gate spacer approximately the same as a maximum width of the source/drain extension layer.

9. The device of claim 8, the source/drain extension layer comprising a doped epitaxial layer and the heavily doped source/drain region comprising a doped polysilicon layer.

10. The device of claim 8, the insulating material comprising silicon nitride.

11. The device of claim 8, further comprising a metal silicide layer disposed on a surface of the heavily doped source/drain region.

12. The device of claim 8, the first and second insulating layer comprising silicon oxide.

13. The device of claim 8, the gate structure further comprising a gate capping layer disposed on the gate electrode.

14. The device of claim 13, the gate capping layer comprising silicon nitride.

* * * * *